US008464137B2

(12) United States Patent
Franceschini et al.

(10) Patent No.: US 8,464,137 B2
(45) Date of Patent: Jun. 11, 2013

(54) PROBABILISTIC MULTI-TIER ERROR CORRECTION IN NOT-AND (NAND) FLASH MEMORY

(75) Inventors: Michele M. Franceschini, White Plains, NY (US); Ashish Jagmohan, White Plains, NY (US); Luis A. Lastras-Montano, Cortlandt Manor, NY (US); Mayank Sharma, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 242 days.

(21) Appl. No.: 12/960,004

(22) Filed: Dec. 3, 2010

(65) Prior Publication Data

US 2012/0144272 A1 Jun. 7, 2012

(51) Int. Cl.
*G06F 11/00* (2006.01)

(52) U.S. Cl.
USPC .......................................... 714/773

(58) Field of Classification Search
USPC .......................................... 714/773
See application file for complete search history.

(56) References Cited

U.S. PATENT DOCUMENTS

| | | | |
|---|---|---|---|
| 5,867,429 A | 2/1999 | Chen et al. | |
| 5,953,255 A | 9/1999 | Lee | |
| 6,469,931 B1 | 10/2002 | Ban et al. | |
| 6,522,580 B2 | 2/2003 | Chen et al. | |
| 7,362,615 B2 | 4/2008 | Pham et al. | |
| 7,376,014 B2 | 5/2008 | Thomas | |
| 7,388,781 B2 | 6/2008 | Litsyn et al. | |
| 7,436,703 B2 | 10/2008 | Pham et al. | |
| 7,453,723 B2 | 11/2008 | Radke | |
| 7,471,559 B2 | 12/2008 | Shibata | |
| 7,480,176 B2 | 1/2009 | Kamei | |

(Continued)

FOREIGN PATENT DOCUMENTS

| | | |
|---|---|---|
| WO | WO0104948 A1 | 1/2001 |
| WO | WO2006055717 A3 | 5/2006 |
| WO | WO2006131915 A3 | 12/2006 |
| WO | WO2007132457 A3 | 11/2007 |

OTHER PUBLICATIONS

Park et al.; A Zeroing Cell-to-Cell Interference Page Architecture with Temporary LSB Storing and Parallel MSB Program Scheme for MLC NAND Flash Memories; IEEE Journal of Solid State Circuits, vol. 43, No. 4, Apr. 2008 pp. 919-928.

(Continued)

*Primary Examiner* — Bryce Bonzo
(74) *Attorney, Agent, or Firm* — Cantor Colburn LLP; Dwayne Nelson (57) ABSTRACT

Error correction in not-and (NAND) flash memory including a system for retrieving data from memory. The system includes a decoder in communication with a memory. The decoder is for performing a method that includes receiving a codeword stored on a page in the memory, the codeword including data and first-tier check symbols that are generated in response to the data. The method further includes determining that the codeword includes errors that cannot be corrected using the first-tier check symbols, and in response second-tier check symbols are received. The second-tier check symbols are generated in response to receiving the data and to the contents of other pages in the memory that were written prior to the page containing the codeword. The codeword is corrected in response to the second-tier check symbols. The corrected codeword is output.

25 Claims, 9 Drawing Sheets

U.S. PATENT DOCUMENTS

| | | |
|---|---|---|
| 2006/0010282 A1 | 1/2006 | Kim |
| 2007/0171714 A1 | 7/2007 | Wu et al. |
| 2007/0245214 A1 | 10/2007 | Ramamoorthy |
| 2008/0092014 A1 | 4/2008 | Brandman et al. |
| 2008/0092026 A1 | 4/2008 | Brandman et al. |
| 2008/0109702 A1 | 5/2008 | Brandman |
| 2008/0123419 A1 | 5/2008 | Brandman et al. |
| 2008/0191266 A1 | 8/2008 | Thomas |
| 2009/0172499 A1* | 7/2009 | Olbrich et al. ............... 714/773 |
| 2011/0041005 A1* | 2/2011 | Selinger ........................ 714/6 |
| 2012/0030545 A1* | 2/2012 | Radke ........................ 714/773 |

OTHER PUBLICATIONS

Shibata et al.; A 70 nm 16 Gb 16-Level-Cell NAND Flash Memory; IEEE Journal of Solid State Circuits; vol. 43, No. 4; Apr. 2008; pp. 929-937.

Soraya Zertal "A Reliability Enhancing Mechanism for a Large Flash Embedded Satellite Storage System"; Third International Conference on Systems; 2008 IEEE; pp. 345-350.

* cited by examiner

PROBABILISTIC MULTI-TIER ERROR CORRECTION IN NOT-AND (NAND) FLASH MEMORY

BACKGROUND

The present invention relates generally to computer memory, and more specifically to probabilistic multi-tier error correction in not-and (NAND) flash memory.

Phase change memories (PCMs) and flash memories are examples of non-volatile memories with limited endurance (also referred to as a "limited life"). Such memories have limited endurance in the sense that after undergoing a number of writing cycles (RESET cycles for PCM, and program/erase cycles for flash memory), the memory cells wear out and can no longer reliably store information NAND flash memories are increasingly being used as non-volatile storage media in both consumer and enterprise applications. One characteristic of contemporary NAND flash memory devices is that they display strong data dependent and device dependent error modes, often with inter-cell dependencies. The programming and charge levels of surrounding cells may have a direct impact on the error conditions that occur in adjoining cells.

NAND memory may also be prone to random errors caused during the programming stage and due to retention errors. Typical error effects include background pattern dependency (BPD) errors, bit-line disturbance (BLD) errors, page and program disturbance (PGM) errors, and floating gate coupling (FGC) errors. The effect of these types of errors can be mitigated in some cases by imposing restrictions on the memory use. By stipulating, for example, that a block of memory can only be written to sequentially, some of these errors may be eliminated or reduced. Such restrictions however, may have unwanted side effects, such as increasing write latency, increasing wear, and write amplification. In addition, different program levels may have non-identical error transition probabilities.

SUMMARY

An embodiment is a system for retrieving data from memory. The system includes a decoder in communication with a memory. The decoder is for performing a method that includes receiving a codeword stored on a page in the memory, the codeword including data and first-tier check symbols that are generated in response to the data. The method further includes determining that the codeword includes errors that cannot be corrected using the first-tier check symbols, and in response second-tier check symbols are received. The second-tier check symbols are generated in response to receiving the data and to the contents of other pages in the memory that were written prior to the page containing the codeword. The codeword is corrected in response to the second-tier check symbols. The corrected codeword is output.

Another embodiment is a computer implemented method for retrieving data from memory. The method includes receiving a codeword stored on a page in the memory, the codeword including data and first-tier check symbols that are generated in response to the data. The method further includes determining that the codeword includes errors that cannot be corrected using the first-tier check symbols, and in response second-tier check symbols are received. The second-tier check symbols are generated in response to receiving the data and to the contents of other pages in the memory that were written prior to the page containing the codeword. The codeword is corrected in response to the second-tier check symbols. The corrected codeword is output.

Another embodiment is a computer program product for retrieving data from memory. The computer program product includes a tangible storage medium readable by a processing circuit and storing instructions for execution by the processing circuit for performing a method. The method includes receiving a codeword stored on a page in the memory, the codeword including data and first-tier check symbols that are generated in response to the data. The method further includes determining that the codeword includes errors that cannot be corrected using the first-tier check symbols, and in response second-tier check symbols are received. The second-tier check symbols are generated in response to receiving the data and to the contents of other pages in the memory that were written prior to the page containing the codeword. The codeword is corrected in response to the second-tier check symbols. The corrected codeword is output.

A further embodiment is a system that includes an encoder in communication with a memory and an error correction cache. The encoder is for performing a method that includes receiving data and a write address of a page in the memory. The memory includes the page and previously written pages. First-tier check symbols are generated in response to data, and second-tier check symbols are generated in response to the data and to contents of at least one of the previously written pages. The first-tier check symbols and the data are stored as a codeword in the page, and the data and the second-tier check symbols are stored in the error correction cache.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

An embodiment is directed to improving the reliability of not-and (NAND) flash memories by using error correction techniques which compute different error weights for different memory cells based, for example, on temporal history, surrounding bit-patterns and the relationship between such surrounding bit-patterns and background pattern dependency (BPD) errors, bit-line disturbance (BLD) errors, page and program disturbance (PGM) errors, and floating gate coupling (FGC) errors.

An embodiment includes a multi-tier error-correction system where the later tier decoding process exploits statistical knowledge of the effect of temporal history and two-dimensional (2D) data/bit-patterns in memory cell neighborhoods on the data stored in a given cell. Thus, different error weights are assigned to different memory cell positions based on read levels and neighboring bit-patterns. These error weights incorporate the notion that cell locations are more or less likely to have induced errors, and are more or less likely to have certain types of induced errors (where an error type is defined by the cell's values before and after the error occurred), based on the programmed values and based on values stored in the neighboring cell locations.

Embodiments described herein provide several advantages over previous solutions. First, they model specific error effects rather than using generic error correction codes, and thus embodiments enhance reliability. Second, embodiments do not require any changes to the device circuits, and thus are easy to use in practice with any NAND flash device. In addition, embodiments may be used in conjunction with circuit level improvements in order to enhance reliability more than is possible by circuit level improvements alone. Further, by utilizing temporal history to update error weights, the embodiments described herein adapt to the characteristics of a specific NAND device. Still further, embodiments may be used along with conventional error codes, such that they are invoked only when the conventional code fails. This ensures that embodiments can be used without an inordinate increase in read latency.

An embodiment uses a two-tier error correction code (ECC). In an embodiment, the first-tier ECC is generated using an algorithm that includes an algebraic ECC whose parity bits/symbols are stored in a page spare-area of the flash memory. A second-tier ECC is generated whose parity bits/symbols are stored partially in the page spare area of the flash memory and partially in a secondary memory structure such as another non-volatile memory region (e.g., flash memory, hard-disk). In an embodiment, a log-based file structured flash memory device is used with a second-tier ECC encoder utilizing data programmed in the previous few pages and cached for access, in order to compute the second-tier ECC parity symbols.

As used herein, the term "bit" refers to a binary digit that takes values in a two letter alphabet, traditionally from the set 0 and 1. As used herein the term "symbol" refers to something that can take on a larger number of values than a bit, i.e., it takes values in a finite alphabet with possibly more than two letters. Thus, a symbol may take on four possible values, from the alphabet $\{0, 1, 2, 3\}$.

In an embodiment, during decoding, data read from a flash memory is first input to a conventional first-tier ECC decoder which has low latency. If the data can be corrected by the first-tier ECC decoder, then the corrected data is output. If the data cannot be corrected by the first-tier ECC decoder, then it is input to a second-tier ECC module, which reads and uses a 2D block bit-pattern to perform more sophisticated error-correction analysis. In an embodiment, this involves computing error weight vectors for various cell locations based on how likely each cell location is to be erroneous, and how likely each error type is for that cell location. The term error weight value denotes a conditional probability value, which indicates the likelihood of an error of a given type, including no error. The weights, or conditional probability values are assigned according to a weight, or probability model that is updated based on the errors detected by an error correction module.

Figure 1:
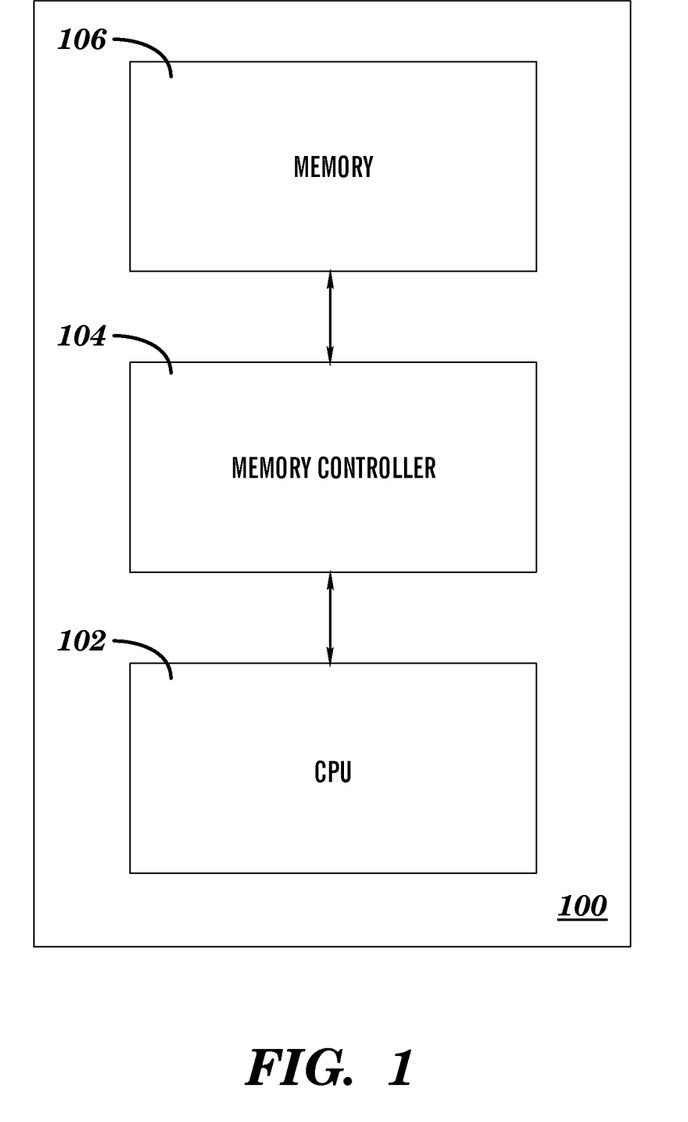
FIG. 1 illustrates a block diagram of a system for storing and retrieving data in a memory in accordance with an embodiment.

FIG. 1 illustrates a block diagram of a system for storing and retrieving data in a memory in accordance with an embodiment. The system 100 depicted in FIG. 1 includes a computer processor 102, a memory 106 having memory cells, and a memory controller 104 for receiving data from the computer processor 102 to be stored in the memory 106. In an embodiment, the memory cells are arranged into pages, and pages are arranged into blocks. Thus, a block may contain a plurality of pages, each page containing a plurality of memory cells.

In an embodiment the memory controller 104 is communicatively coupled to the computer processor 102 and receives write requests from the computer processor 102. The write requests contain data to be written to the memory 106 and a logical address for identifying the location in the memory 106 to which the data will be written. The memory controller 104 stores data at a physical address within the memory 106. In an embodiment, the memory controller 104 maps the logic address to a physical address in the memory 106 when storing or retrieving data. The physical address for a given logical address can change each time data in the memory 106 is modified.

The system 100 is one example of a configuration that may be utilized to perform the processing described herein. Although the system 100 has been depicted with only a single memory 106, memory controller 104, and computer processor 102, it will be understood that other embodiments would also operate in other systems with two or more of the memory 106, memory controller 104, or computer processor 102. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
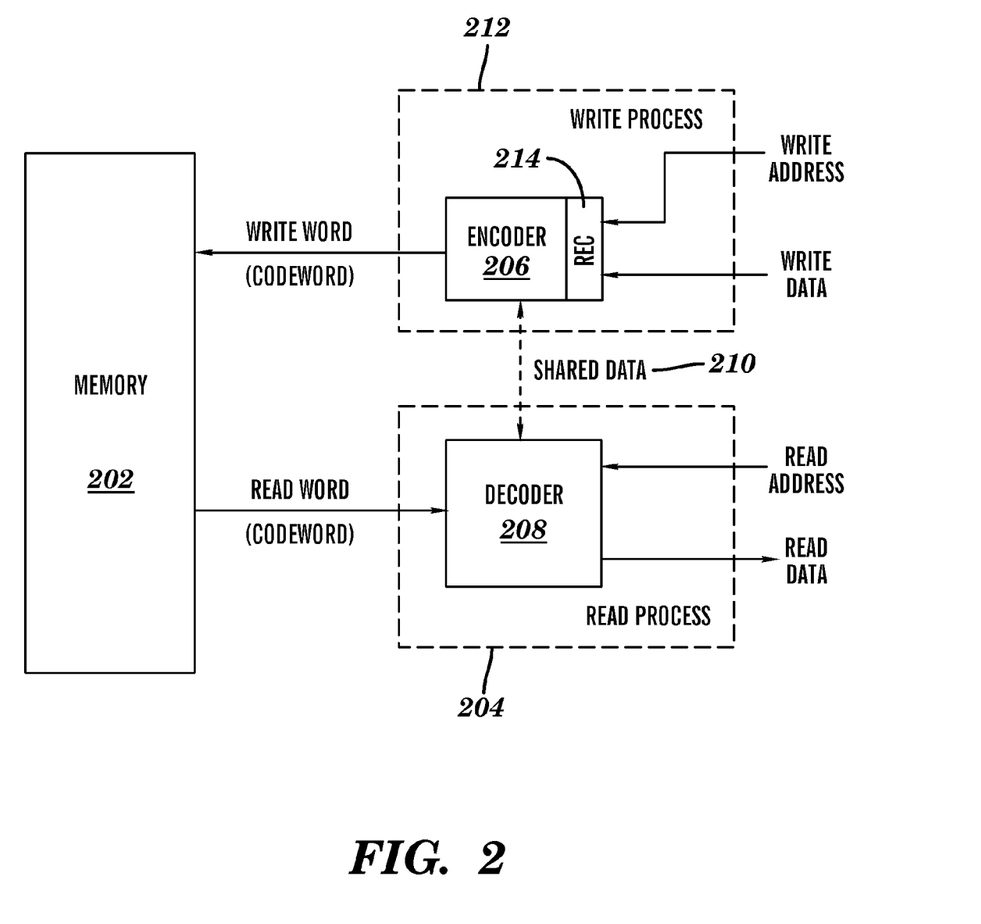
FIG. 2 illustrates a block diagram of a system for storing and retrieving data in a memory in accordance with an embodiment.

FIG. 2 illustrates a block diagram of a system for storing and retrieving data in a memory in accordance with an embodiment. The system depicted in FIG. 2 includes a memory 202 (such as memory 106) having blocks of memory cells (each block made up of pages), an encoder 206 for receiving write data and generating an ECC write word for storage in the memory cells, a decoder 208 for receiving a read word from the memory and generating read data, and shared data 210 storing characteristics of the stored data for use by both the encoder 206 and the decoder 208. In an embodiment, the encoder 206 and the shared data 210 are used by a write process 212, and the decoder 208 and the shared data 210 are utilized by a read process 204.

In an embodiment the encoder 206, decoder 208, and shared data 210 are located on a memory controller (such as memory controller 104) or memory module. In an alternate embodiment, the encoder 206, decoder 208, and shared data 210 are located on a memory device. The shared data 210 may be stored in a register or any other storage location that is accessible by both the encoder 206 and the decoder 208.

In an embodiment, the memory 202 is implemented by NAND flash memory devices or other non-volatile memory devices such as, but not limited to phase change memory (PCM) devices. In an embodiment, the memory 202 is implemented by a single level cell NAND flash memory device. In another embodiment, the memory 202 is implemented by a multi-level cell NAND flash memory device.

Inputs to the encoder 206 depicted in FIG. 2 include the address of the page to be written (also referred to herein as a "write address"), and the data to be written to the page (also referred to herein as "write data"). As shown in FIG. 2, the inputs are received via a receiver 214 located on the encoder 206. In an embodiment, the inputs are received via a receiver (e.g., located on a memory device, memory module, memory controller, or other location). The receiver may be implemented in a variety of manners including hardware for receiving the inputs and/or a storage location (e.g., a register) where the inputs are located.

An input to the decoder 208 depicted in FIG. 2 includes the address of the memory location (e.g., a page) to be read. In an embodiment, the input is received via a receiver 214 (e.g., located on a memory device, memory module, memory controller, or other location). The receiver may be implemented in a variety of manners including hardware for receiving the inputs and/or a storage location (e.g., a register) where the inputs are located.

An output from the decoder 208 depicted in FIG. 2 includes the read data. In an embodiment, the outputting is by a transmitter (e.g., located on a memory device, memory module, memory controller, or other location). The transmitter (not shown) may be implemented in a variety of manners including hardware for transmitting the output and a storage location or register where the outputs are stored. The encoder 206 and decoder 208 are examples of computers that may be utilized to perform the processing described herein.

Figure 3:
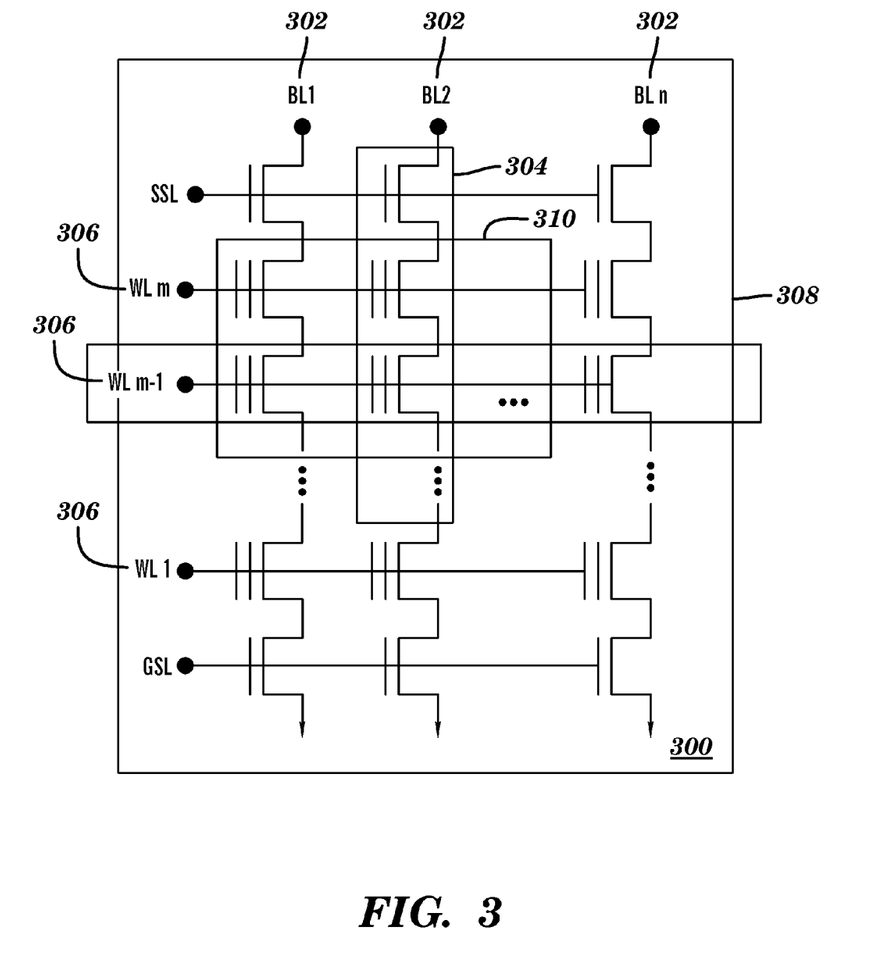
FIG. 3 illustrates a block diagram of a not-and (NAND) flash memory that may be implemented by an embodiment.

FIG. 3 illustrates a block diagram of a NAND flash memory, such as memory 106 of FIG. 1 or memory 202 of FIG. 2, in accordance with an embodiment. The NAND flash memory 300 depicted in FIG. 3 includes a plurality of memory cells that are arranged in word lines 306 and bit lines 302. In an embodiment, a page is made up of bits in the memory cells in a word line 306. In an embodiment that includes a multi-level cell (MLC) device, each page is made up of a given bitplane from a row of cells. For example, one page may include the least significant bits of a row of cell, while another may include the most significant bits of a row of cell.

In an embodiment, a mapping between physical and logical block addresses is maintained in a controller, such as memory controller 104. Given a logical address and data for a write, the controller selects an erased physical page to write the data onto and records the logical-to-physical mapping. In an embodiment, a log-based file system is used, where the physical page is the next erased page in the block to which the last logical page was written to, where the pages are sequenced, for example on the basis of proximity to the global select line (GSL).

NAND flash memories exhibit data and device dependent errors based on a number of factors. These errors include, for example, BPD errors, BLDs, FGC errors, PGM errors, and other non-uniform errors and error transitions. The errors occur based on both the data stored in the NAND flash, but also the locations of the memory cells relative to one another. In an embodiment, a target page of memory 308 of FIG. 3 may be affected by FGC when other neighboring cells are programmed, such as, for example the block of cells 310 of FIG. 3. Similarly, the target page of memory 308 can be affected by BLD/BPD when cells along one of the bit lines 302 are written to, for example, the cells at 304. In addition, the target page of memory can be affected by PGM errors if the page is reprogrammed or when adjoining pages of memory are written to. In addition, errors such as the random switching of symbols based on degradation of NAND flash memory 300 may create additional errors, which tend to be non-uniform in type (i.e. depending on the device, certain types of errors may be more likely than other types of errors). All of these types of errors may be statistically modeled to provide predictive error detection and correction. For example, knowledge that an erroneous bit transition from "01" to "10" caused by a non-uniform error in a MLC NAND block, is much more likely than "10" to "01" can be used to more accurately recover an error in the target page of memory 300.

Figure 4:
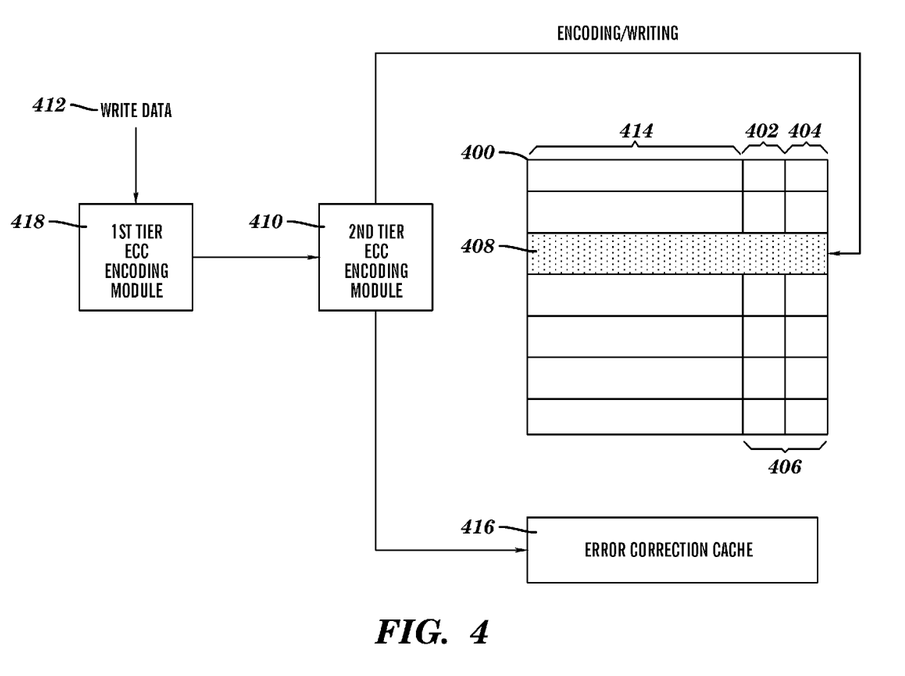
FIG. 4 illustrates a block diagram of a NAND flash memory and second-tier encoding module in accordance with an embodiment.

FIG. 4 depicts a flash memory 400 for storing data using a two-tier ECC process in accordance with an embodiment. In an embodiment flash memory 400 is a NAND flash memory, and the first-tier ECC encoding module 418 and the second-tier ECC encoding module 410 are implemented by the encoder 206 during the write process 212 as depicted in FIG. 2.

The flash memory 400 depicted in FIG. 4, stores a plurality of write words (also referred to herein as codewords) that include data and ECC check bits/check-symbols, such as the word stored at target page 408. As shown in FIG. 4, each word includes a data segment 414 for storing bytes of data (i.e., write data), and two or more error correction segments 406 for storing check bits/check-symbols associated with data in data segment 414. In an embodiment, the error correction segments 406 include a first-tier error correction segment 402 for storing first-tier check bits/symbols, and a second-tier error correction segment 404 for storing second-tier check bits/symbols. Write data 412 that is to be stored in the flash memory 400 is received for processing at the first-tier ECC encoding module 418 (e.g., for generating first-tier check symbols) and then passed to the second-tier ECC encoding module 410 for processing (e.g., for generating second-tier check symbols). In an embodiment, the write data 412 is received from a computer processor such as computer processor 102 of FIG. 1 or from another encoding module in the encoder 206. In other embodiments, the write data 412 is received by both the first-tier ECC encoding module 418 and the second-tier ECC encoding module 410, and they perform their processing independently and possibly overlapping in time to generate the check symbols associated with the write data 412 that is stored in the data segment 414.

In an embodiment, the first-tier ECC encoding module 418 generates ECC check symbols from the write data 412 using a Reed-Solomon code or other ECC code that uses techniques such as, but not limited to: repetition codes, parity symbols, check sums, and cryptographic hashes.

In an embodiment, the second-tier ECC encoding module 410 generates ECC check symbols from the write data 412 and previously written data pages (containing, for example, write words or codewords) using a low density parity check (LDPC) code. In an embodiment the LDPC code is based on a statistical model of flash error modes and previously written data that has been cached in an error correction cache 416 is used to generate the second-tier ECC check symbols as will be described in more detail below.

Once the first-tier ECC encoding module 418 and the second-tier ECC encoding module 410 have completed processing and have generated ECC check symbols, the write data and the first and second-tier ECC check symbols are stored in the target page 408. The write data 412 (also referred to herein as "data") is stored in the data segment 414 of the flash memory 400, the first-tier ECC check symbols are stored in the first-tier error correction segment 402, and the second-tier ECC check symbols are stored in the second-tier error correction segment 404. In alternate embodiments, the second-tier ECC check symbols are stored in a separate flash memory. In other embodiments, the second-tier ECC check symbols are split between the second-tier error correction segment 404 and a separate flash memory. A copy of the write data 412 and the second-tier error correction symbols 404 is also stored in an error correction cache 416. In another embodiment, the error correction cache additionally stores the first-tier error correction segment 402 check symbols. In an embodiment, the error correction cache 416 is written to a volatile memory such as dynamic random access memory (DRAM) or embedded DRAM (eDRAM) or static random access memory (SRAM) or other volatile memory with a relatively small read latency. In another embodiment the error correction cache 416 is written to a non-volatile memory such as PCM.

In an embodiment, the error correction cache 416 is configured to store "C" pages of historical data, where C is the number of previously written pages of historical data used to calculate the second-tier ECC code for the data 412. In an embodiment, these pages are the previous C pages programmed into the same block as the current page. C is programmable and can be any size, however both the effectiveness of the second-tier ECC code and the storage capacity requirements for the error correction cache 416 increases as C increases. In an embodiment, C may be programmed based on a number of times the memory block has been programmed, a symbol error rate of the memory block, or a statistical error model of the memory. In additional embodiments, the error correction cache 416 is any storage device capable of rapid storage and retrieval of data as is known in the art.

Figure 5:
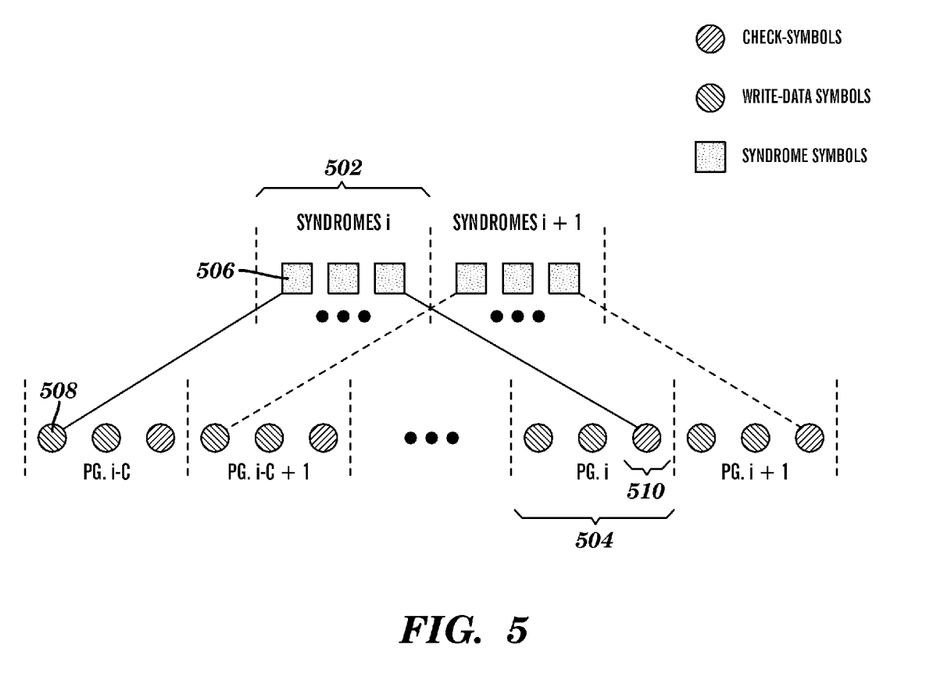
FIG. 5 illustrates a second-tier error correction code correction calculation mechanism in accordance with an embodiment.

FIG. 5 depicts a block diagram for generating second-tier ECC check symbols in accordance with an embodiment. The second-tier ECC generation is executed, in an embodiment, on the second-tier ECC encoding module 410 of FIG. 4. The number of check symbols in the second-tier ECC (or the "rate" of the ECC) is generated based on a statistical model of the various types of errors described above (e.g. BPD, BLD, FGC, PGM, non-uniform error types, etc.) In an embodiment, the second-tier ECC encoding module 410 generates checks, such as check symbols i 510. In an embodiment, write data is received at time "i" for storage in memory, such as memory 106 in FIG. 1. Check symbols i 510 (i.e., for the write data to be stored in memory) are calculated at time i by using the write data and second-tier ECC check-symbol component of the last C pages written into the same block as the page currently being written, which is stored in the error correction cache 416 in FIG. 4, as well as the write data received for the current page. In an embodiment, C is calculated as the size, in symbols, of the error correction cache 416 divided by the page size in symbols. In an embodiment, the check symbols i 510 are calculated using an a-priori selected low density parity check (LDPC) matrix. The parity check matrix allows computation of syndrome symbols 502 as a linear combination of write data symbols and second-tier ECC check symbols. Further, the parity check matrix is such that the syndrome symbols i 502 are computed as a linear combination of write data page symbols and check symbols belonging only to the current page and the C previous pages that belong to the same block stored in the error correction cache 416. The check symbols 510 for the current page are computed so as to ensure that the syndrome symbols 502 are all zeros. The write data, as well as the second-tier ECC check symbols are stored in memory. The LDPC matrix is created using techniques known to those of ordinary skill in the art.

Although the second-tier flash aware ECC generation has been described as being executed in the second-tier ECC encoding module 410 of FIG. 4, it will be understood that the second-tier flash aware ECC generation may be executed as software on the computer processor 102, or as a hardware or software module either in the memory 106, the memory controller 104, the encoder 206, or as a standalone module.

Figure 6:
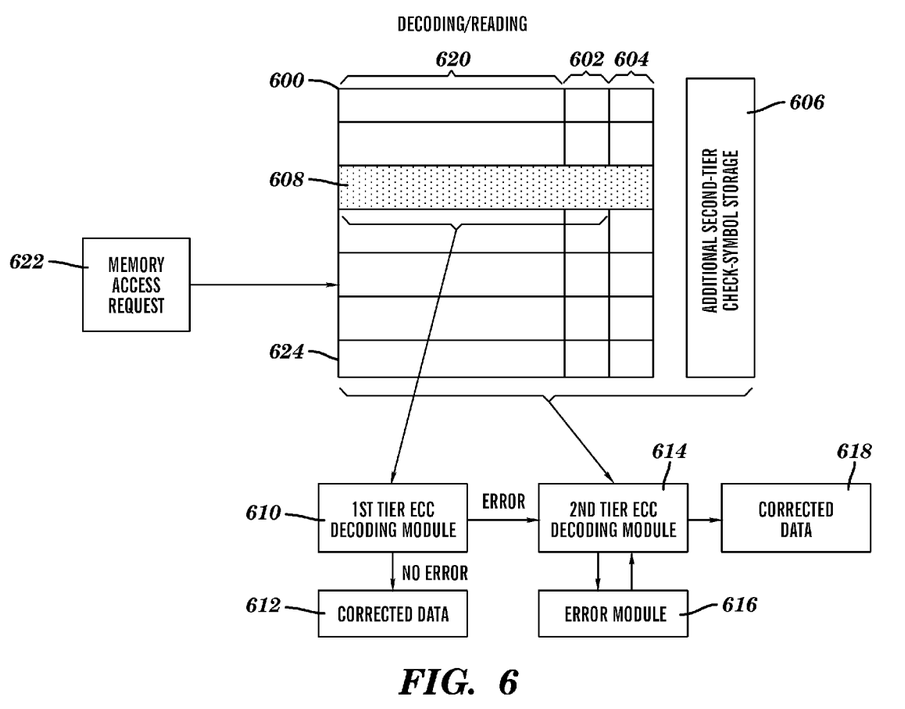
FIG. 6 illustrates a block diagram of a NAND flash memory and second-tier decoding module in accordance with an embodiment.

FIG. 6 depicts an embodiment of retrieving the data from a memory 600, such as the memory 106 of FIG. 1. A memory access request 622 is received from a requestor. In an embodiment, the memory access request 622 (which includes a memory address corresponding to a page of data 608 in the memory 600) is received at a decoder, such as decoder 208 in FIG. 2. The page of data 608 (also referred to herein a "codeword") is retrieved from the memory 600. As shown in FIG. 6, the page of data 608 includes a data segment 620, first-tier ECC check symbols 602 and second-tier ECC check symbols 604. A first-tier ECC module 610 checks the page of data 608 to determine if the data has errors and if such errors are correctable by the first-tier ECC decoder. If the page of data has no errors, or if the errors are correctable by the first-tier ECC check symbols, then it is returned to the requestor. In an embodiment, further decoding is performed on the corrected data 612 (e.g., symbol expansion, decompression, etc.) before it is returned to a requestor as read data.

If the first-tier ECC decoding module 610 determines that the page of data 608 contains errors that are not correctable by the first-tier ECC decoding module 610, then data from the block 624, containing the page 608, as well as any additional second-tier check symbols stored in other check symbol storage 606, is passed to a second-tier ECC decoding module 614 for further processing. The second-tier ECC decoding module 614 corrects the data using the second-tier ECC check symbols stored in the second-tier error check symbols 604 and storage 606, and an error probability model 616 as described in more detail below. The error probability model is meta-data, which is stored in volatile DRAM or non-volatile memory or a combination thereof. Once the data is corrected, the error probability model 616 is updated based on the error that was corrected. The updated error probability model 616 is used and similarly updated each time a second-tier error correction is required. Once the data has been corrected, the corrected data 618 is returned to the requestor.

In an embodiment, when the first-tier ECC check symbols 602 and the second-tier ECC check symbols 604 are stored in different locations, only the data segment 620 and the first-tier ECC check symbols 602 are retrieved in response to the memory access request 622. In this embodiment, the second-tier ECC check symbols 604 and storage 606 are only retrieved if the second-tier ECC decoding module 614 is utilized to decode the page.

Figure 7:
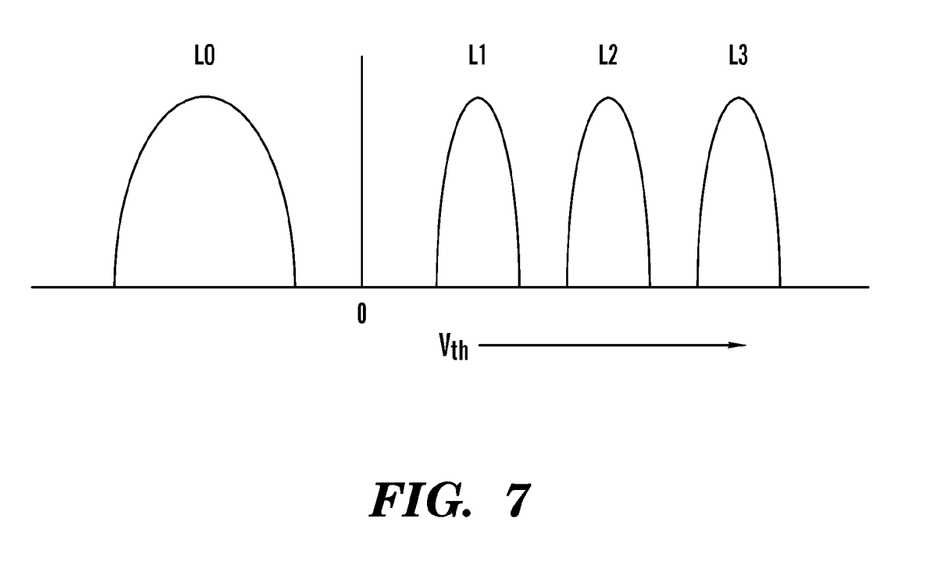
FIG. 7 illustrates threshold voltages used to store four levels of information in a multi-level cell (MLC) NAND flash cell in accordance with an embodiment.

FIG. 7 depicts threshold voltages used to store 4 levels of information in a four-multi-level cell (4MLC) NAND flash cell in an embodiment. The 4MLC includes four discrete symbols of data in one memory cell of a flash memory.

Although FIG. 7 depicts a 4MLC voltage threshold, it will be understood that in other embodiments other voltage thresholds and bit levels of MLC can be used. In order of increasing threshold voltage, the four levels are denoted as L0, L1, L2 and L3.

Figure 8:
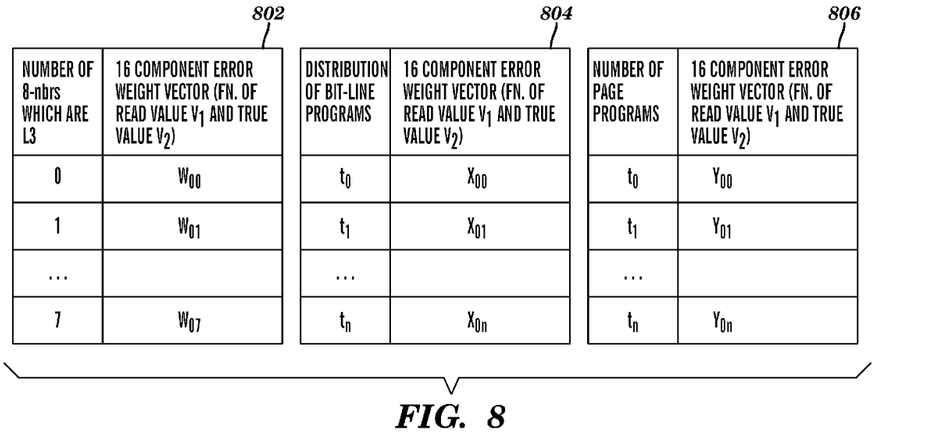
FIG. 8 illustrates look-up tables with weights corresponding to two dimensional (2D) data patterns for MLC NAND flash in accordance with an embodiment.

FIG. 8 depicts an embodiment of an error probability model 616, encapsulated in terms of a set of look-up tables. The statistical error probability model 616 contains information on how likely a particular programmed level stored on a cell is likely to change to another particular level due to an error. The likelihood of such an error event depends, in general, on factors such as the two dimensional (2D) data pattern in the neighborhood of the cell (which affects FGC type errors), the programming history of other cells on the same page and other pages (which affects BPD, BLD and PGM-type errors), as well as device-dependent level-transition behavior. In an embodiment, the statistical error probability model 616 includes a collection of conditional probability values (also denoted "error weights"), each of which encapsulates the likelihood that a stored value will change to another value conditioned on one or more of the factors described above. In another embodiment, the statistical error model includes one or more a-posteriori conditional probabilities each of which encapsulates the likelihood that, given the value read from a cell, and of one or more of the above-mentioned factors, the original value stored on the cell was a given level, which may be different from the level read.

In the embodiment is FIG. 8, each look-up table stores a-posteriori error weights (i.e., conditional probabilities), which encapsulate the likelihood that the value read from a given cell $v_1$ arises from a true stored value $v_2$ in error, as a function of $v_1$, $v_2$ and one of the factors described above. Each of the error weight vectors w, x and y has 16 components where component $v_2*4+v_1$ represents the probability that the true stored value was $v_2$, conditioned on the read value being $v_1$, and on the value of the factor that the respective table is based upon. In one embodiment, a first error weight vector in weight table one 802 is assigned by counting the number of 8-neighbors of each of the page locations, which are at MLC level L3, and factoring in the data value of the page location. Thus, for example, $w_{00}$ is a 16 component vector with component $w_{00}(v_2*4+v_1)$ representing the probability that the true stored value was $v_2$, conditioned on the read value being $v_1$, and conditioned upon the fact that none of the 8 neighboring values was L3. In an embodiment, a second error weight vector as shown in weight table two 804 is computed based upon the distribution of cell values programmed on the same bit line as the current cell, and based on the current data value. The third error vector in weight table three 806 is computed on the basis of the number of page-programs and the current data value. These tables are updated after every decoding by the second-tier ECC decoding module 614, thereby incorporating temporal history into the weight models. This allows the weight models to adapt to the specific NAND flash device being used, which may vary significantly from other devices. In one embodiment, the error frequencies observed in each second-tier ECC decoding are linearly combined with the model's error weights to form the new model error weights. Other techniques well known in the art can be used to update the model by incorporating empirical frequencies observed in each use of the second-tier ECC decoder. In another embodiment, errors observed in each use of the first-tier ECC decoder are also used to update the model.

In an alternate embodiment, a subset of the weight tables shown in FIG. 8 is combined and higher dimensional weight models are used to model the joint effect of these conditions. In another embodiment, the weight tables additionally incorporate the effect of the number of program/erase cycles on the page, the number of errors previously seen on the page, the number and types of errors seen on neighboring pages, and the sequence in which pages were programmed. In further embodiments, weights are computed on a per-vector rather than a per-cell basis. In yet another embodiment, stored metadata includes the sequence in which the block pages were programmed, and the weight computation is based on this sequence. Thus, for example, the error weight vector in weight table one 802 depends on the number of cell locations in the neighborhood of a given cell which were programmed after the given cell location. In an alternative embodiment, the decoding is performed on multiple pages simultaneously. In an embodiment, the second-tier ECC decoding module 614 of FIG. 6 uses dynamic programming; thus, for example a Viterbi algorithm might be used to decode multiple pages simultaneously.

Figure 9:
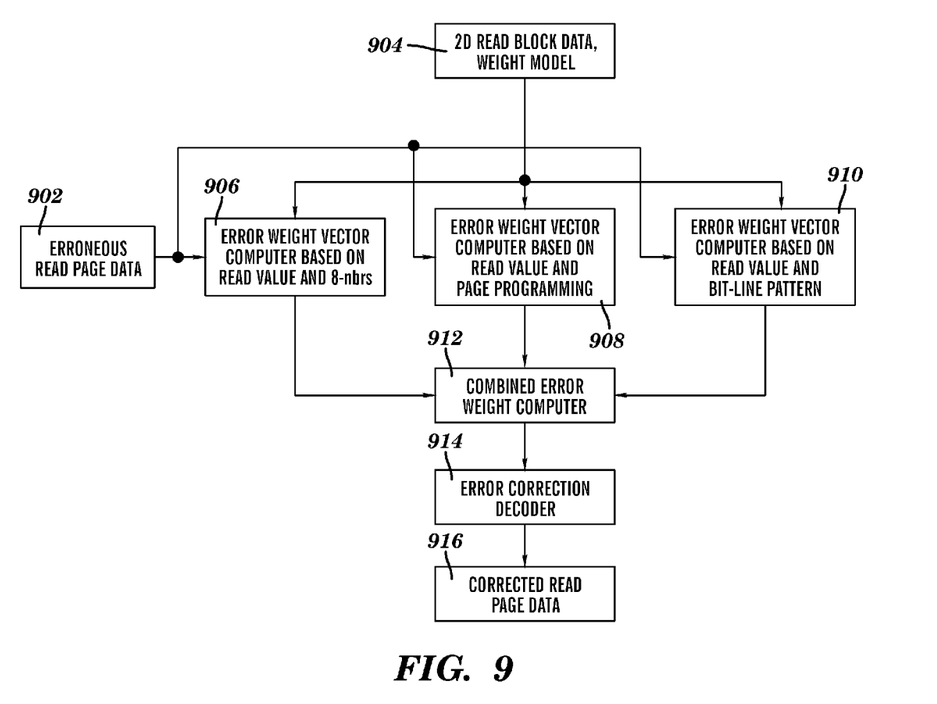
FIG. 9 illustrates a process flow for correction errors using a second-tier error correction in accordance with an embodiment.

FIG. 9 depicts a process flow for the correction of errors in data in an embodiment. In an embodiment, the error correction of FIG. 9 is executed in the second-tier ECC decoding module 614 of FIG. 6. At block 902, data that contains errors that were not correctable by the first-tier ECC decoding module 610, is received. At block 904, an error probability model (such as error probability model 616, and the error probability model in FIG. 8) is retrieved based on the 2D read block data corresponding to a memory block in which the data resides. At block 906, an error probability model which models conditional error probabilities for each cell value based on the eight cell neighborhood of the cell is used in conjunction with the values read from the cell, in order to compute a probability vector for the cell. The $i^{th}$ component of this vector is the probability that the true stored value in the cell is level i. In an example embodiment, the probability model in table 802 is used to compute such a probability vector for each cell. This probability vector is also termed an error weight vector. At block 908, an error probability model which models conditional error probabilities for each cell value based on the number of times each page has been programmed is used in conjunction with the values read from the cell, in order to compute a probability-vector for the cell. The $i^{th}$ component of this vector is the probability that the true stored value in the cell is level i. In an example embodiment, the probability model in error weight table three 806 of FIG. 8 is used to compute such a probability vector for each cell. This probability vector is also termed an error-weight vector. At block 910, an error probability model which models conditional error probabilities for each cell value based on the bit-line pattern (i.e. the values read from other cells on the same bit-line as the given cell) is used in conjunction with the values read from the cell, in order to compute a probability-vector for the cell. The $i^{th}$ component of this vector is the probability that the true stored value in the cell is level i. In an embodiment, the probability model in table 804 is used to compute such a probability vector for each cell. This probability vector is also termed an error-weight vector.

At block 912, the error weight vectors computed in blocks 906, 908 and 910 are combined to form one error weight vector for each cell. The $i^{th}$ component of this vector is the probability that the true stored value in the cell is level i, conditioned on the values read from the cell and from other cells in the block. In an embodiment, a conditional independence assumption is used to produce the aggregate error weight vector for each cell (i.e. the probability that the true value for the given cell is i is an appropriately normalized product of the probabilities that the true value for the given cell is i, given by the individual error weight vectors.) At block 914, a soft error correction decoder uses the aggregate weighted correction vector calculated at block 912 to the erroneous data. In an embodiment, the decoder is an LDPC decoder, which uses a message passing algorithm to decode the data, using an algorithm well known in the art such as sum-product or max-product. At block 916, the corrected read page data is produced and returned to the requestor.

Technical effects and benefits include improved reliability of error correction by taking a statistical model of flash memory error modes into account when calculating the error correction. An additional benefit is improved lifetime of a device by increasing the reliability of the flash memory by accurately correcting more errors. A further benefit is that no hardware device changes are required to implement the invention. Yet another benefit is that write restrictions (e.g., prohibition on non-sequential programming, partial page programming) may be eased as a result of the ability to provide correction based on a statistical model of errors based on BPD, BLD, FGC, PGM etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flow diagrams depicted herein are just one example. There may be many variations to this diagram or the steps (or operations) described therein without departing from the spirit of the invention. For instance, the steps may be performed in a differing order or steps may be added, deleted, or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A system for retrieving data from memory, the system comprising:
    a decoder in communication with a memory, the decoder for performing a method comprising:
    receiving a codeword stored on a page in the memory, the codeword comprising data and first-tier check symbols, the first-tier check symbols generated in response to the data;
    determining that the codeword includes errors that cannot be corrected using the first-tier check symbols; and
    responsive to the determining:
    receiving second-tier check symbols, the second-tier check symbols generated in response to the data and to contents of other pages in the memory written prior to the page containing the codeword;
    correcting the codeword responsive to the second-tier check symbols; and
    outputting the corrected codeword.

2. The system of claim 1, wherein the correcting the codeword is further responsive to a statistical error model.

3. The system of claim 2, wherein the statistical error model is changed, responsive to the determining.

4. The system of claim 2, wherein the statistical error model is used by a message passing algorithm for correcting the codeword using the codeword and the second-tier check symbols.

5. The system of claim 1, wherein the correcting the codeword is further responsive to an aggregate error weight vector for each cell, that is calculated from at least one of a bit line disturbance error weight vector for the cell, a floating gate coupling error weight vector for the cell, and an error weight vector derived from a number of page programs for that cell.

6. The system of claim 5, wherein the calculating the error weight vector for a cell is further responsive to contents of memory cells within a specified neighborhood of that memory cell.

7. The system of claim 1, wherein the memory is a multi-level cell (MLC) not-and (NAND) flash memory and the correcting the codeword is further responsive to a set of look-up tables comprising error weights corresponding to two dimensional data patterns.

8. The system of claim 1, wherein the method further comprises:
    determining that the codeword does not include errors that cannot be corrected using the first-tier check symbols and in response correcting the codeword responsive to the codeword and the first-tier check symbols.

9. The system of claim 1, wherein at least a subset of the second-tier check symbols are stored in a second memory.

10. A computer implemented method for retrieving data from memory, the method comprising:
    receiving a codeword stored on a page in a memory, the codeword comprising data and first-tier check symbols, the first-tier check symbols generated in response to the data;
    determining, at a computer, that the codeword comprises errors that cannot be corrected using first-tier check symbols; and
    responsive to the determining:
    receiving second-tier check symbols, the second-tier check symbols generated in response to the data and to contents of other pages in the memory written prior to the page containing the codeword;
    correcting the codeword responsive to the second-tier check symbols; and
    outputting the corrected codeword.

11. The method of claim 10, wherein the memory is a multi-level cell (MLC) not-and (NAND) flash memory and the correcting the codeword is further responsive to a set of look-up tables comprising error weights corresponding to two dimensional data patterns.

12. The method of claim 10, further comprising:
    determining that the codeword does not include errors that cannot be corrected using the first-tier check symbols and in response correcting the codeword responsive to the codeword and the first-tier check symbols.

13. A computer program product for retrieving data from memory, the computer program product comprising:
    a computer readable storage medium having program code embodied therewith, the program code executable by a processing circuit to perform a method comprising:
    receiving a codeword stored on a page in a memory, the codeword comprising data and first-tier check symbols, the first-tier check symbols generated in response to the data;
    determining, at a computer, that the codeword comprises errors that cannot be corrected using first-tier check symbols; and
    responsive to the determining:
    receiving second-tier check symbols, the second-tier check symbols generated in response to the data and to contents of other pages in the memory written prior to the page containing the codeword;
    correcting the codeword responsive to the second-tier check symbols; and
    outputting the corrected codeword.

14. The computer program product of claim 13, wherein the correcting the codeword is further responsive to a statistical error model.

15. The computer program product of claim 14, wherein at least a subset of the second-tier check symbols are stored in a second memory.

16. The computer program product of claim 13, wherein the correcting the codeword is further responsive to an aggregate error weight vector for each cell, that is calculated from at least one of a bit line disturbance error weight vector for the cell, a floating gate coupling error weight vector for the cell, and an error weight vector derived from a number of page programs for the cell.

17. The computer program product of claim 16, wherein the calculating the error weight vector for a cell is further includes contents of memory cells within a specified neighborhood of the cell.

18. The computer program product of claim 13, wherein the memory is a multi-level cell (MLC) not-and (NAND) flash memory and the correcting the codeword is further responsive to a set of look-up tables comprising error weights corresponding to two dimensional data patterns.

19. The computer program product of claim 13, wherein the method further comprises:
   determining that the codeword does not include errors that cannot be corrected using the first-tier check symbols and in response correcting the codeword responsive to the codeword and the first-tier check symbols.

20. A system comprising:
   an encoder in communication with a memory and an error correction cache, the encoder for performing a method comprising:
   receiving data and a write address of a page in the memory, the memory comprising the page and previously written pages;
   generating first-tier check symbols responsive to data;
   generating second-tier check symbols responsive to the data and to contents of at least one of the previously written pages;
   storing the first-tier check symbols and the data as a codeword in the page; and
   storing the data and the second-tier check symbols in the error correction cache.

21. The system of claim 20, further comprising:
   a decoder in communication with the memory and the error correction cache, the decoder for performing a method comprising:
   receiving the codeword and the second-tier check symbols;
   determining that the codeword includes errors that cannot be corrected using the first-tier check symbols; and
   correcting the codeword responsive to the second-tier check symbols.

22. The system of claim 20, wherein the generating the second-tier check symbols is further responsive to a low density parity check (LDPC) code.

23. The system of claim 20, wherein the generating second-tier check symbols is responsive to contents of a programmable number of previously written pages.

24. The system of claim 20, wherein the memory is a not-and (NAND) flash memory, and the generating second-tier check symbols is responsive to a programmable number of previously written pages in the same block as the page being currently written, wherein data from these previously written pages is stored in the error correction cache.

25. The system of claim 20, wherein a number of previously written pages used is changed responsive to at least one of: a number of times the memory block has been programmed, a symbol error rate of the memory block, and a statistical error model of the memory.

\* \* \* \* \*